United States Patent
Akiyama et al.

(10) Patent No.: US 9,117,880 B2
(45) Date of Patent: Aug. 25, 2015

(54) METHOD FOR MANUFACTURING SEMICONDUCTOR DEVICE

(71) Applicant: MITSUBISHI ELECTRIC CORPORATION, Tokyo (JP)

(72) Inventors: Hajime Akiyama, Tokyo (JP); Akira Okada, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/188,378

(22) Filed: Feb. 24, 2014

(65) Prior Publication Data

US 2014/0342544 A1   Nov. 20, 2014

(30) Foreign Application Priority Data

May 20, 2013   (JP) .................................. 2013-105985

(51) Int. Cl.
*H01L 21/66* (2006.01)
*H01L 21/768* (2006.01)

(52) U.S. Cl.
CPC .............. *H01L 21/768* (2013.01); *H01L 22/30* (2013.01); *H01L 22/34* (2013.01)

(58) Field of Classification Search
USPC .......................................................... 438/18
See application file for complete search history.

(56) References Cited

U.S. PATENT DOCUMENTS

| | | | |
|---|---|---|---|
| 2009/0218652 A1* | 9/2009 | Moriya et al. | 257/459 |
| 2010/0295043 A1* | 11/2010 | Yasumura et al. | 257/48 |
| 2011/0024911 A1* | 2/2011 | Shibuya et al. | 257/773 |
| 2012/0024911 A1* | 2/2012 | Obrist | 222/389 |
| 2012/0061828 A1* | 3/2012 | Konishi et al. | 257/737 |

FOREIGN PATENT DOCUMENTS

| | | |
|---|---|---|
| JP | 10-096746 A | 4/1998 |
| JP | 2003-130889 A | 5/2003 |

* cited by examiner

*Primary Examiner* — Asok K Sarkar
(74) *Attorney, Agent, or Firm* — Studebaker & Brackett PC

(57) ABSTRACT

A semiconductor wafer is subjected to a protection film formation step process as a process before evaluation of electrical characteristics. In this process, after an insulating film serving as a protection film is formed, a photolithography process and an etching process are performed so as to form a protection film having a plurality of openings exposing an emitter electrode. Then, electrical characteristics are evaluated by bringing a contact probe in contact with the exposed emitter electrode through each opening.

14 Claims, 7 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and particularly to a method for manufacturing a semiconductor device including the step of evaluating electrical characteristics.

2. Description of the Background Art

In manufacturing of a semiconductor device, electrical characteristics of a semiconductor element formed on a semiconductor substrate are determined. These electrical characteristics are evaluated based on a state of a wafer or a state of a chip. Here, a wafer or a chip (a subject) is initially fixed to a chuck stage while a ground surface of the subject is brought in contact with a surface of the chuck stage by vacuum suction or the like.

Then, for electrical input and output to and from the subject, a contact probe is brought in contact with a prescribed electrode of the subject. In a case that electrical characteristics of a semiconductor device for electric power (a power device) as a semiconductor device are evaluated, a contact probe having multiple pins (a plurality of pins) has conventionally been employed as the contact probe in order to meet demands or the like for evaluation of electrical characteristics with a high current and a high voltage.

Under such circumstances, it has been known that, during evaluation of electrical characteristics of a subject, a partial discharge phenomenon occurs, for example, between a contact probe and the subject and thus such a disadvantage as partial breakage of a measured portion is caused. If the subject in which partial discharge has occurred is transferred to a subsequent step as a non-defective item, it is very difficult to extract the subject in which partial discharge has occurred.

Therefore, it is important to take measures in advance for suppressing partial discharge, and various proposals have been made. For example, Japanese Patent Laying-Open No. 2003-130889 has proposed a technique to evaluate electrical characteristics of a subject while it is immersed in an insulating liquid. In addition, Japanese Patent Laying-Open No. 10-96746 has proposed a technique to conduct electrical measurement while a subject is arranged in an atmosphere of an inert gas.

In the conventional techniques, however, the following problems are assumed. Initially, in the technique to immerse a subject in an insulating liquid, a contact probe relatively expensive is required as a contact probe. In addition, since electrical characteristics are evaluated in the insulating liquid, it takes time for evaluation, which is considered as one factor interfering with suppression of production cost.

Moreover, in a case that a subject is a semiconductor element in a wafer test or a chip test, it is also necessary to completely remove the insulating liquid from the semiconductor element after evaluation of electrical characteristics ends, and it is considered that a series of evaluations is complicated and cannot easily be applied.

On the other hand, in the technique to arrange a subject in an inert gas, a construction of an evaluation apparatus is complicated and it takes time for evaluation of electrical characteristics. Therefore, this technique is also again considered as one factor interfering suppression of production cost.

SUMMARY OF THE INVENTION

The present invention was made to solve the problems assumed above, and an object thereof is to provide a method for manufacturing a semiconductor device capable of readily evaluating electrical characteristics of a subject while production cost is suppressed.

A method for manufacturing a semiconductor device according to the present invention includes the following steps. A semiconductor substrate having a main surface is prepared. A plurality of electrode pads are formed on the main surface of the semiconductor substrate. A protection film exposing the plurality of electrode pads and covering other regions is formed. By bringing a contact probe in contact with the exposed electrode pads, electrical characteristics are evaluated. In the step of evaluating electrical characteristics, electrical characteristics are evaluated by bringing a plurality of contact probes in contact with one electrode pad of the plurality of electrode pads. In the step of forming a protection film, a plurality of openings are formed in the protection film in such a manner that a portion where each of at least one contact probe and other contact probes of the plurality of contact probes comes in contact with one electrode pad is exposed.

According to the method for manufacturing a semiconductor device of the present invention, a protection film having a plurality of openings in such a manner that a portion where each of at least one contact probe and other contact probes is in contact with one electrode pad is exposed is formed, and electrical characteristics are evaluated by bringing each of one contact probe and other contact probes in contact with one electrode pad through the individual opening. Thus, electrical characteristics of a semiconductor can readily be evaluated without using a complicated semiconductor evaluation apparatus while increase in production cost is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
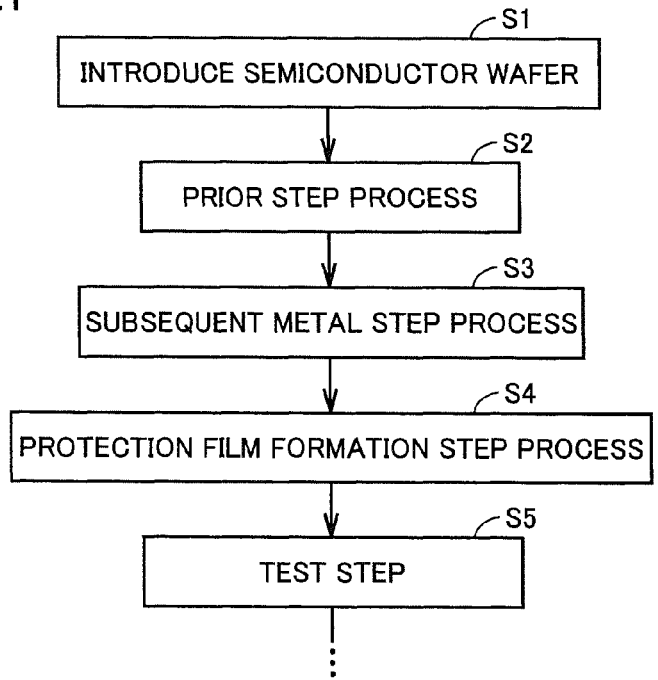
FIG. 1 is a flowchart of a method for manufacturing a semiconductor device according to each embodiment of the present invention.

Initially, an outline of a method for manufacturing a semiconductor device will be described. As shown in FIG. 1, initially, in step S1, a semiconductor wafer is introduced in a manufacturing line. Then, in step S2, a prior step process for forming a prescribed semiconductor element or the like, such as a step of forming a conductive film, a step of performing a photolithography process, a step of performing an etching process, a step of implanting ions, and a step of performing heat treatment, is performed.

Then, in step S3, a subsequent metal step process for forming an interconnection pattern is performed. For example, an interconnection of a first layer is formed by forming a film of a metal of a first layer and thereafter performing a photolithography process and an etching process. Depending on a semiconductor device, an interconnection of a second layer or the like is formed thereafter.

Then, in step S4, a protection film formation step process is performed as a process before evaluation of electrical characteristics. In this process, a protection film having an opening pattern exposing an electrode pad is formed by forming an insulating film serving as a protection film and thereafter performing a photolithography process and an etching process. Then, in step S5, an electrical test of a semiconductor device (evaluation of electrical characteristics) is conducted. Electrical characteristics are evaluated by bringing a contact probe in contact with the exposed electrode pad.

After the test step is completed, a semiconductor wafer (a semiconductor chip) determined as a non-defective item is subjected to a necessary subsequent step process (now shown) and thus it is completed as a semiconductor device. It is noted that, after the test step is completed, the protection film is either removed or peeled off, or left as it is in order to maintain a discharge prevention effect.

The protection film formation step process and the test step will mainly specifically be described below.

First Embodiment

Figure 2:
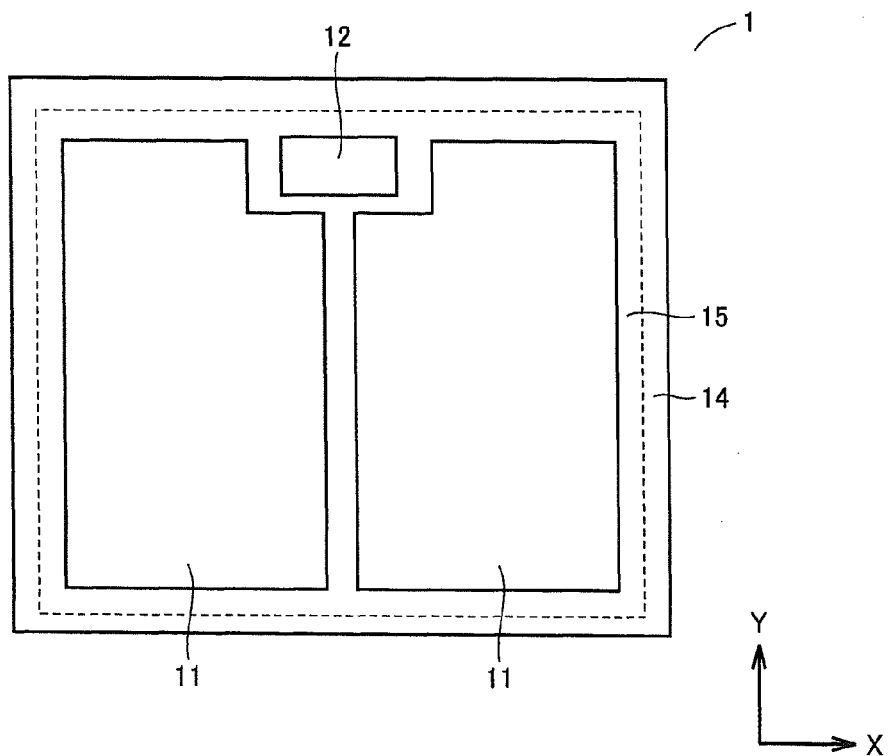
FIG. 2 is a plan view of a semiconductor device before a protection film is formed, showing one step in the method for manufacturing a semiconductor device according to a first embodiment of the present invention.

FIG. 2 shows one example of a two-dimensional schematic structure of a semiconductor device before formation of a protection film, which is formed on a semiconductor wafer which has gone through step S1 to step S3 (see FIG. 1). As shown in FIG. 2, a semiconductor device 1 is divided into an element region 15 and an edge region 14. In element region 15, for example, such a power semiconductor element as an IGBT (Insulated Gate Bipolar Transistor) is formed. Terminal region 14 is arranged in an outer peripheral portion of one semiconductor device 1 in order to hold a withstand voltage, and in this case, it is formed to surround element region 15.

On a surface of element region 15, an electrode pad for electrical input and output to and from the outside is formed, and in this case, an emitter electrode 11 is formed. In addition, on a back surface of element region 15 as well, an electrode pad (not shown) for electrical input and output to and from the outside is formed, and in this case, a collector electrode is formed. Furthermore, on the surface of element region 15, a gate electrode 12 is formed.

Then, in step S4, a protection film is formed. A film serving as the protection film is an insulating film. This insulating film is preferably formed of a material which is thermally and chemically stable during evaluation of electrical characteristics and has excellent insulating performance. Specifically, a photoresist, an insulating sheet (for example, of polyimide, Kapton®, polyphenyl silsesquioxane, and polyvinyl silsesquioxane), and the like are exemplified, however, limitation thereto is not intended. It is noted that, in the case that Kapton® is applied, a sheet material having an adhesive layer is preferred.

Figure 3:
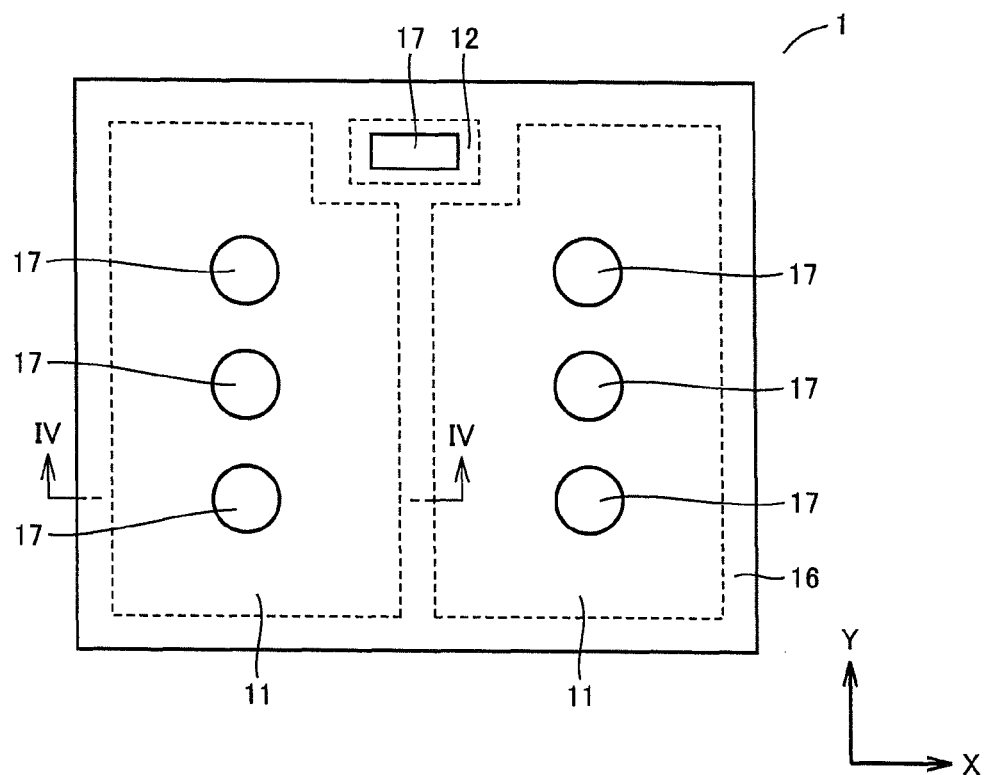
FIG. 3 is a plan view of the semiconductor device in which the protection film has been formed, showing a step performed after the step shown in FIG. 2 in the first embodiment.
Figure 4:
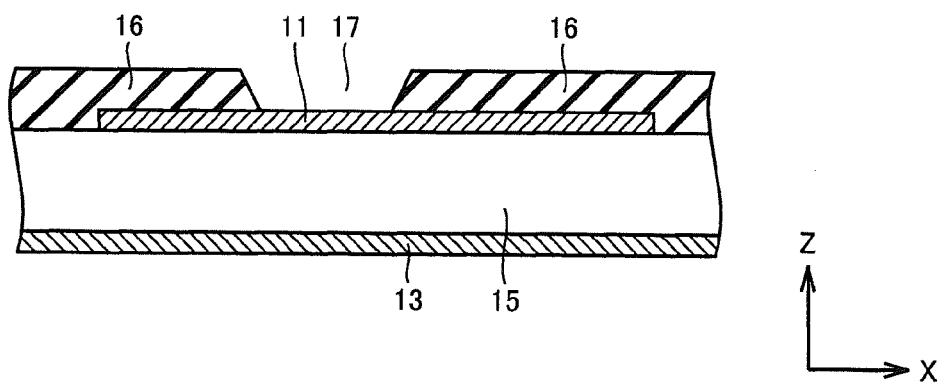
FIG. 4 is a cross-sectional view along the line IV-IV shown in FIG. 3, in the first embodiment.

FIGS. 3 and 4 each show one example of a semiconductor device in which a protection film has been formed. As shown in FIGS. 3 and 4, in a protection film 16 of this semiconductor device 1, openings 17 exposing a plurality of locations are formed for one emitter electrode 11.

In such a power semiconductor element as an IGBT, electrical characteristics are evaluated by applying a high current and a high voltage. When a high current is applied and that high current is concentrated to one contact probe, current density is excessively high and heat is generated. Then, measures for suppressing heat generation by lowering density of a current which flows through one contact probe by bringing a plurality of contact probes in contact with one electrode pad are taken.

In the present semiconductor device, assuming that three contact probes are brought in contact with one emitter electrode 11, three openings 17 are formed in protection film 16 such that they correspond to three contact probes, respectively.

Figure 5:
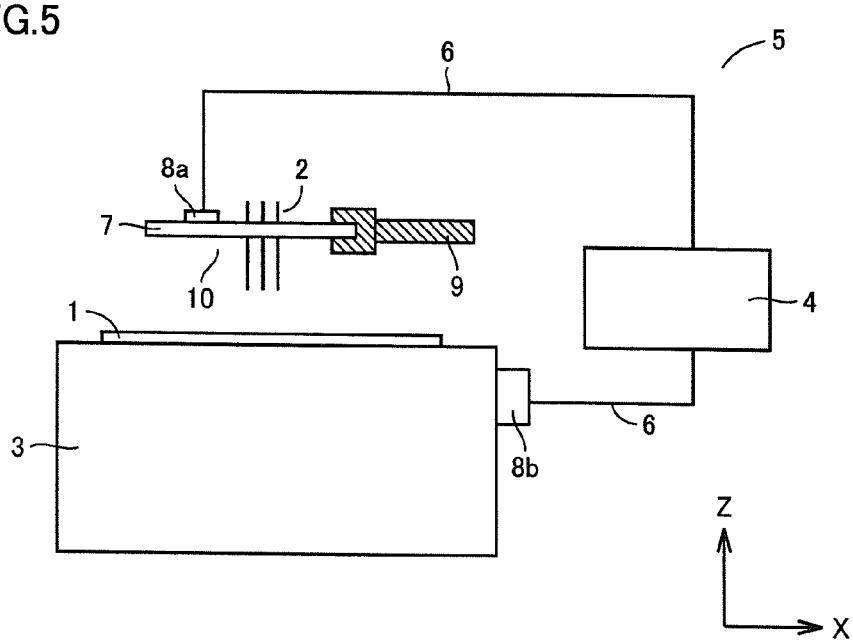
FIG. 5 is a diagram schematically showing a structure of a semiconductor evaluation apparatus showing a step performed after the step shown in FIG. 3, in the first embodiment.

An outline of a semiconductor evaluation apparatus for evaluating electrical characteristics of a semiconductor device will now be described. As shown in FIG. 5, a semiconductor evaluation apparatus 5 for evaluating semiconductor device 1 having a vertical structure is provided with a plurality of contact probes 10 and a chuck stage 3. The plurality of contact probes 10 come in contact with an electrode pad formed on a surface of semiconductor device 1, as one electrode electrically connected to semiconductor device 1. Chuck stage 3 comes in contact with a back surface (a ground surface) of semiconductor device 1, as the other electrode electrically connected to semiconductor device 1.

Contact probe 10 is connected to an insulating base 7. A connection portion 8a is attached to insulating base 7, and contact probe 10 is electrically connected to an evaluation control unit 4 through a signal line 6 via connection portion 8a. On the other hand, a connection portion 8b is attached to a side surface of chuck stage 3, and a surface of chuck stage 3 is electrically connected to evaluation control unit 4 through signal line 6 via connection portion 8b.

It is noted that a plurality of contact probes 10 are installed in consideration of application of a high current as described above. Then, connection portion 8a and connection portion 8b are arranged at such positions that a distance between connection portion 8a and connection portion 8b is substantially the same through any contact probe 10 and such that density of a current applied to each contact probe 10 is substantially the same.

In addition, each contact probe 10 and connection portion 8a are electrically connected to each other, for example, through a metal plate (not shown) provided on insulating base 7. A probe base 2 constituted of contact probe 10, insulating base 7, and connection portion 8a is movable by a moving arm 9 in any direction.

Alternatively, instead of moving probe base 2, semiconductor device 1, that is, chuck stage 3, may be moved. Chuck stage 3 is a support with which the ground surface of semiconductor device 1 is brought in contact and fixed, and it has, for example, a vacuum suction function as fixing means. It is noted that means for holding semiconductor device 1 is not limited to vacuum suction, and for example, electrostatic attraction or the like is applicable.

After evaluation of prescribed electrical characteristics such as evaluation of a withstand voltage is completed, the insulating protection film is removed or peeled off. In the case that the protection film is formed of a photoresist, it is decomposed and removed through an ashing step and washed as necessary. In the case that the protection film is formed from a sheet, the sheet is basically peeled off and removed, however, the process may proceed to a mount step without peeling off the sheet so as to maintain a discharge prevention effect. In the case of a sheet, use of a sheet material having an adhesive layer would facilitate attachment and removal. It is noted that, in the case that the protection film is constituted of a plurality of layers, a photoresist and a sheet may be used as combined. The semiconductor device (semiconductor wafer) from which the protection film has been removed is subjected to a subsequent step process, and thus a semiconductor device is completed.

According to the method for manufacturing a semiconductor device described above, in evaluating electrical characteristics, insulating protection film 16 is formed in advance, and a plurality of openings 17 are formed in protection film 16 in correspondence with the plurality of contact probes, respectively. Thus, in the case that partial discharge occurs in the vicinity of individual contact probe 10, influence on a semiconductor device by that partial discharge can effectively be suppressed.

In addition, even in the case that partial discharge occurs between one contact probe 10 and the other contact probe which are adjacent to each other, influence on a semiconductor device by that partial discharge can effectively be suppressed. Furthermore, such an insulating protection film can be formed of a photoresist, a sheet, or the like, and influence by partial discharge can be suppressed without application of a complicated semiconductor evaluation apparatus while increase in production cost is suppressed.

In the method for manufacturing a semiconductor device described above, the case that three openings 17 are formed in protection film 16 in order to bring three contact probes in contact with one emitter electrode 11 has been described. The number of openings is not limited as such, and an appropriate number of openings are preferably formed depending on a size of an electrode pad (emitter electrode 11), an applied current, the number of contact probes, and the like.

First Variation

In connection with the method for manufacturing a semiconductor device described above, the case that an insulating film of a single layer is formed as a protection film has been described. Here, an exemplary case that a protection film having insulating films stacked is formed as a protection film will be described.

Figure 6:
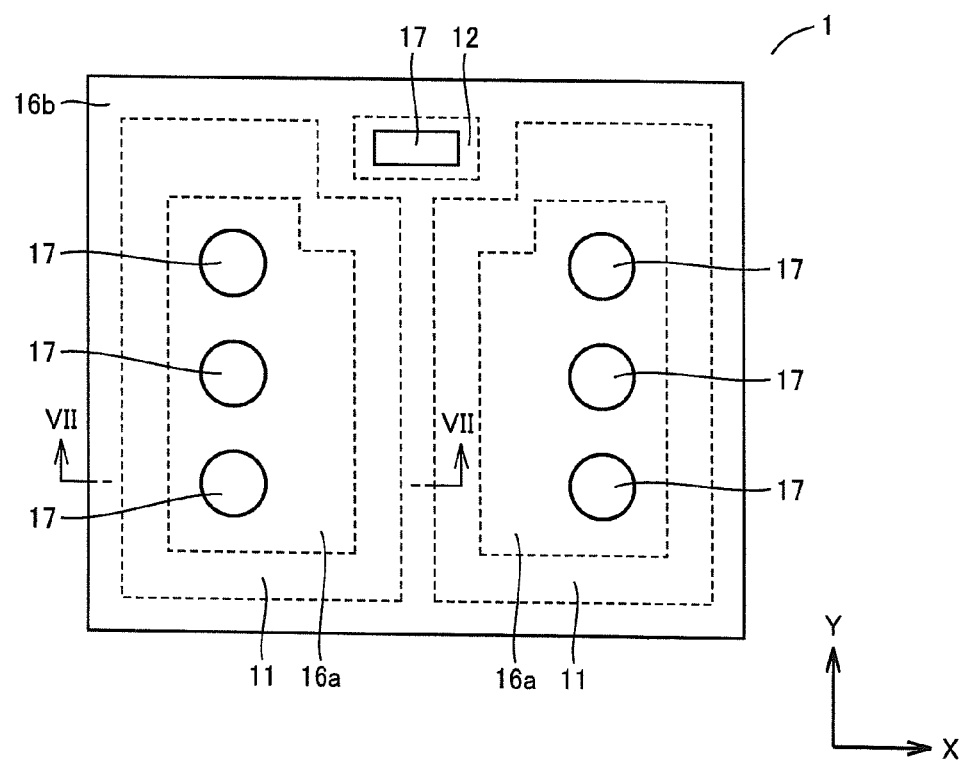
FIG. 6 is a plan view of a semiconductor device in which a protection film has been formed, showing one step in a method for manufacturing a semiconductor device according to a first variation of the first embodiment.
Figure 7:
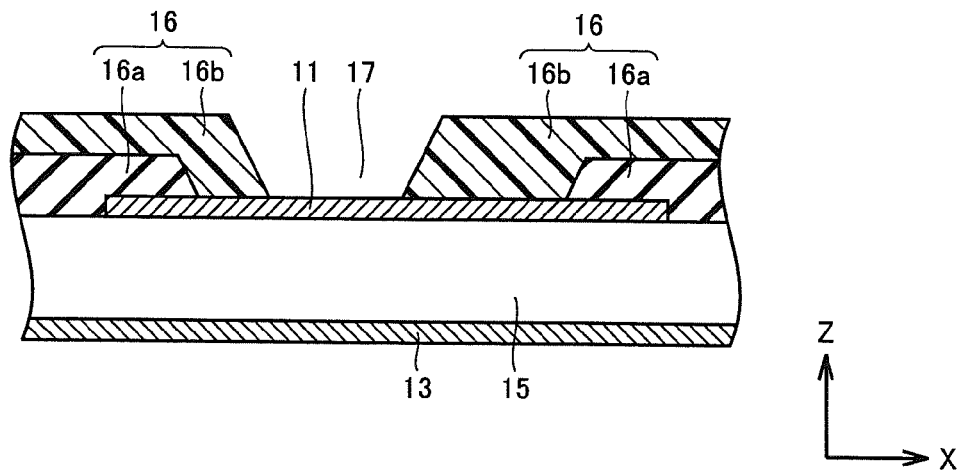
FIG. 7 is a cross-sectional view along the line VII-VII shown in FIG. 6, in the first embodiment.

FIGS. 6 and 7 each show one example of a semiconductor device in which a protection film has been formed in step S4 (see FIG. 1). As shown in FIGS. 6 and 7, a first protection film 16a and a second protection film 16b are stacked as protection film 16. In that protection film 16, three openings 17 are formed in protection film 16 in correspondence with three contact probes, respectively, assuming that three contact probes are brought in contact with one emitter electrode 11. Since features are otherwise the same as those in the method for manufacturing a semiconductor device shown in FIG. 3 and the like, the same member has the same reference number allotted and description thereof will not be repeated unless it is necessary.

Materials for stacked protection films may be the same or different from each other. For example, first protection film 16a (a first layer) may be formed from a sheet, second protection film 16b (a second layer) may be formed of a photoresist, only second protection film 16b may be removed while first protection film 16a may be left after evaluation of electrical characteristics, and a subsequent step process may be performed. This is because a greater opening is required for wire bonding of an electrode pad in a subsequent step.

According to the method for manufacturing a semiconductor device in the first variation, first protection film 16a and second protection film 16b as two layers are formed as protection film 16, and in that two-layered protection film 16, in correspondence with a plurality of contact probes, respectively, a corresponding number of openings 17 are formed in protection film 16. Thus, when partial discharge occurs in the vicinity of individual contact probe 10 or when partial discharge occurs between one contact probe 10 and the other contact probe which are adjacent to each other, influence on a semiconductor device by that partial discharge can further effectively be suppressed. In addition, such a protection film can be formed of a photoresist, a sheet, and the like, and influence by partial discharge can be suppressed while increase in production cost is suppressed.

Though the case that three openings 17 are formed in protection film 16 has been described in the method for manufacturing a semiconductor device according to the first variation, the number of openings is not limited as such, and an appropriate number of openings are preferably formed, depending on a size of an electrode pad (emitter electrode 11), an applied current, the number of contact probes, and the like. In addition, though two-layered protection film 16 has been described by way of example of the number of layers of stacked protection film 16, the number of layers is not limited to two either.

Second Variation

Here, another exemplary case that a protection film having insulating films stacked is formed as a protection film will be described.

Figure 8:
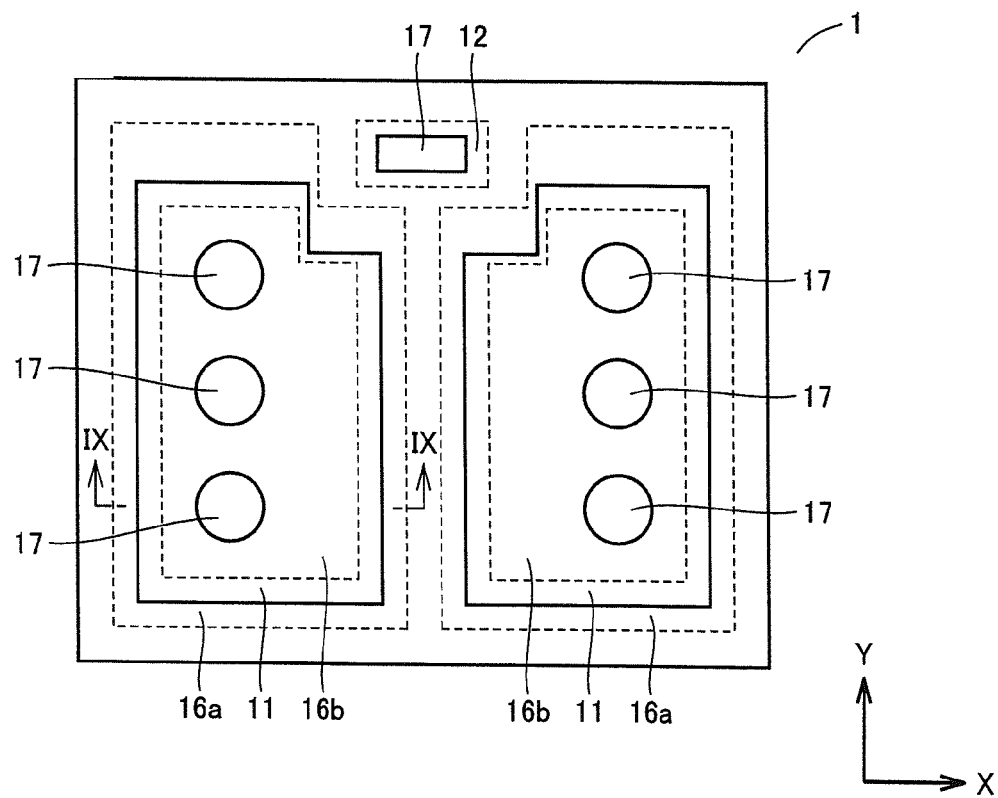
FIG. 8 is a plan view of a semiconductor device in which a protection film has been formed, showing one step in a method for manufacturing a semiconductor device according to a second variation of the first embodiment.
Figure 9:
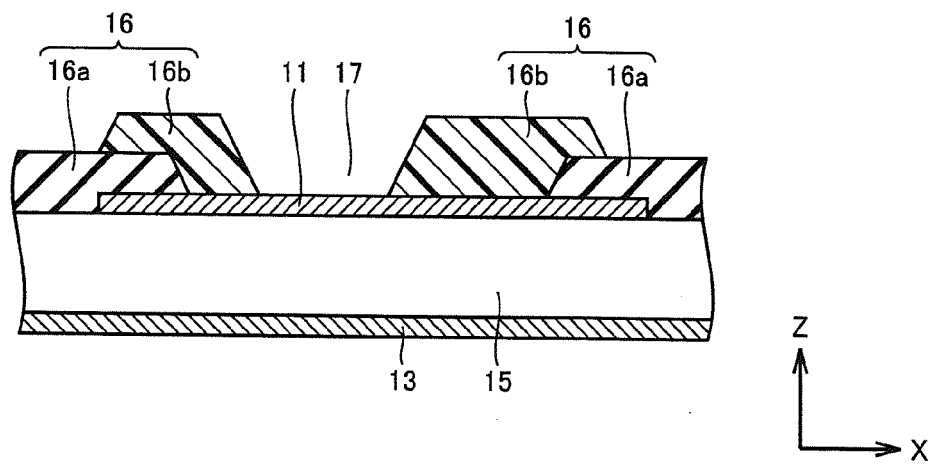
FIG. 9 is a cross-sectional view along the line IX-IX shown in FIG. 8, in the first embodiment.

FIGS. 8 and 9 each show one example of a semiconductor device in which a protection film has been formed in step S4 (see FIG. 1). As shown in FIGS. 8 and 9, first protection film 16a and second protection film 16b are stacked as protection film 16. In that protection film 16, in correspondence with three contact probes, respectively, three openings 17 are formed in protection film 16, assuming that three contact probes are brought in contact with one emitter electrode 11.

In the second variation, in particular, a region where second protection film 16b is stacked on first protection film 16a is limited to a partial region. Since features are otherwise the same as those in the method for manufacturing a semiconductor device shown in FIG. 3 and the like, the same member has the same reference number allotted and description thereof will not be repeated unless it is necessary.

According to the method for manufacturing a semiconductor device in the second variation, as in the first variation, first protection film 16a and second protection film 16b as two layers are formed as protection film 16, and in that two-layered protection film 16, in correspondence with a plurality of contact probes, respectively, a corresponding number of openings 17 are formed in protection film 16. Thus, when partial discharge occurs in the vicinity of individual contact probe 10 or when partial discharge occurs between one contact probe 10 and the other contact probe which are adjacent to each other, influence on a semiconductor device by that partial discharge can further effectively be suppressed. In addition, such a protection film can be formed of a photoresist, a sheet, and the like, and influence by partial discharge can be suppressed while increase in production cost is suppressed.

Moreover, in the method for manufacturing a semiconductor device according to the second variation, second protection film 16b is formed as being limited to a partial region. Here, an effect of limiting second protection film 16b to a partial region in the case that second protection film 16b is formed of a photoresist will be described.

In the case that stacked second protection film 16b is formed of a photoresist, second protection film 16b formed of a photoresist is decomposed and removed in an ashing step after evaluation of electrical characteristics. Dust or foreign matters produced at that time and mainly caused by the photoresist may adhere to the surface of the semiconductor device (semiconductor wafer), which may be one factor for lower yield of semiconductor devices.

In order to lessen adhesion of such foreign matters or the like, a photoresist which is to be decomposed and removed is desirably minimized, and to that end, the second protection film is desirably formed as being limited to a region where an effect of suppression of discharge or prevention of discharge should be exhibited. The region where an effect of suppression of discharge or prevention of discharge should be exhibited is exemplified not only by a region around an opening shown in FIG. 8 but also by a region between a plurality of electrode pads, a region around an electrode pad, a region in the vicinity of a terminal region, and the like.

In addition, in the method for manufacturing a semiconductor device according to the second variation, though the case that three openings 17 are formed in protection film 16 has been described, as in the first variation or the like, the number of openings is not limited as such, and an appropriate number of openings are preferably formed, depending on a size of an electrode pad (emitter electrode 11), an applied current, the number of contact probes, and the like. Moreover, though two-layered protection film 16 has been described by way of example of the number of layers of stacked protection film 16, the number of layers is not limited to two either.

In connection with a location where partial discharge occurs, it has been known that partial discharge frequently occurs not only in a region around a center of a semiconductor device where an electrode pad with which a contact probe is in contact is arranged but also in an outer peripheral portion of a semiconductor device where a terminal region is formed. Therefore, the second protection film may further additionally be formed in the terminal region and a region in the vicinity thereof.

As described above, in the method for manufacturing a semiconductor device according to the first embodiment including the first variation and the second variation, in evaluating electrical characteristics of a semiconductor device, occurrence of partial discharge can effectively be suppressed by forming an insulating protection film having an opening corresponding to an individual contact probe to be in contact with an electrode pad, in the vicinity of an electrode pad formed on the surface of the semiconductor device. In addition, by stacking protection films, occurrence of partial discharge can further be suppressed. Moreover, by forming a protection film of a photoresist, a process in a routine step can be performed and increase in production cost can be suppressed.

Second Embodiment

Here, one example of a method for manufacturing a semiconductor device in which a protection film provided with an insulating protrusion is formed will be described.

Figure 10:
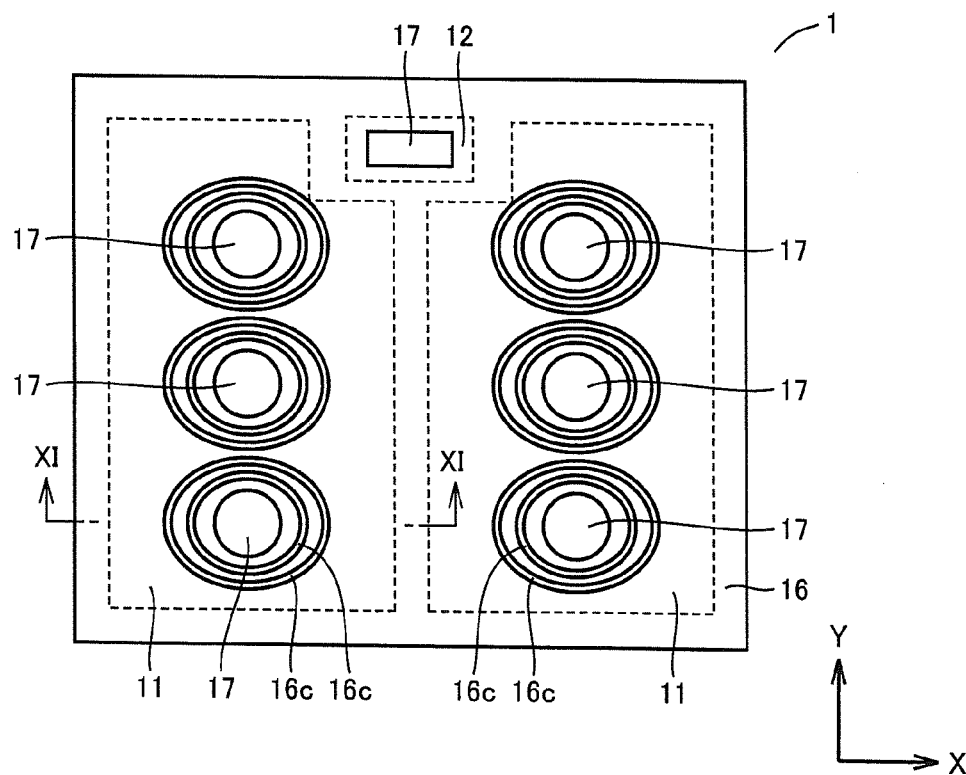
FIG. 10 is a plan view of a semiconductor device in which a protection film has been formed, showing one step in a method for manufacturing a semiconductor device according to a second embodiment of the present invention.
Figure 11:
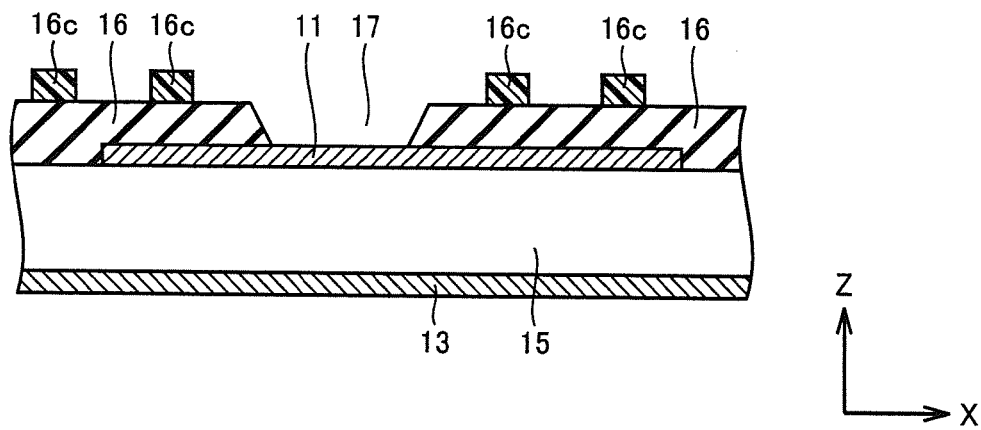
FIG. 11 is a cross-sectional view along the line XI-XI shown in FIG. 10, in the second embodiment.

In step S4, a protection film is formed on a semiconductor wafer which has gone through step S1 to step S3 (see FIG. 1). FIGS. 10 and 11 each show one example of a semiconductor device in which a protection film has been formed. As shown in FIGS. 10 and 11, openings 17 exposing a plurality of locations are formed for one emitter electrode 11 in protection film 16 of semiconductor device 1. Insulating protrusions 16c are formed on a surface of protection film 16 so as to surround openings 17, respectively. Since features are otherwise the same as those in the method for manufacturing a semiconductor device shown in FIG. 3 and the like, the same member has the same reference number allotted and description thereof will not be repeated unless it is necessary.

In the case that protrusion 16c is formed of a photoresist in step S4, it can readily be formed by performing a common photolithography process. In the case that both of protection film 16 and protrusion 16c are formed of a photoresist, both can readily be formed through a photolithography process, and in addition, protection film 16 and protrusion 16c can substantially be the same in thickness (height). Thus, after protection film 16 having protrusion 16c is formed, electrical characteristics are evaluated by a semiconductor evaluation apparatus (step S5).

According to the method for manufacturing a semiconductor device described above, in evaluating electrical characteristics, protection film 16 having protrusions 16c on the surface so as to surround openings 17 is formed. Thus, a creepage distance between exposed electrode pads (emitter electrodes 11) can be ensured, and partial discharge which occurs in the vicinity of an individual contact probe or partial discharge which occurs between contact probes can further effectively be suppressed.

In the method for manufacturing a semiconductor device described above, the case where two (double) protrusions 16c are provided for one opening 17 has been described. The number of protrusions 16c is not limited thereto and the number of protrusions 16c may be increased or decreased depending on a semiconductor device. In addition, a width of protrusion 16c may be set to an appropriate width.

Variation

In the method for manufacturing a semiconductor device described above, the case that a protection film having protrusions surrounding individual respective openings is formed as a protection film has been described. Here, a case that a protection film having a protrusion surrounding a plurality of openings is formed will be described.

Figure 12:
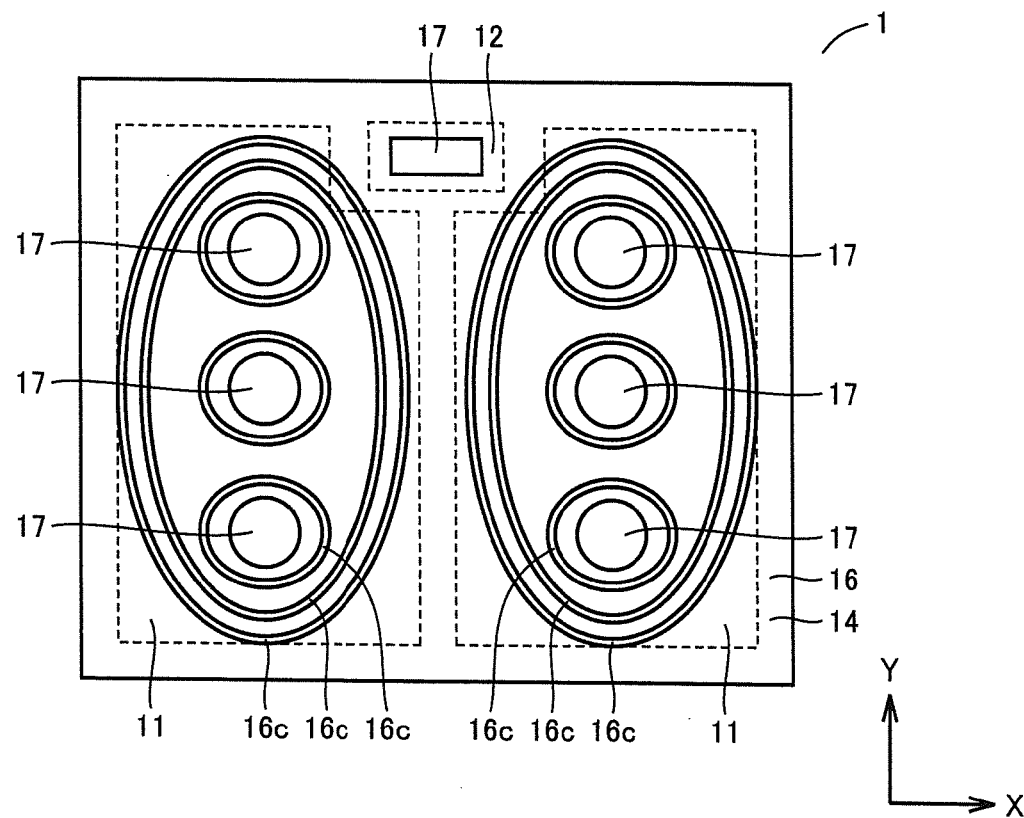
FIG. 12 is a plan view of a semiconductor device in which a protection film has been formed, showing one step in a method for manufacturing a semiconductor device according to a variation of the second embodiment.

FIG. 12 shows one example of a semiconductor device in which a protection film has been formed in step S4 (see FIG. 1). As shown in FIG. 12, in addition to protrusion 16c surrounding individual opening 17, protection film 16 having protrusion 16c surrounding a plurality of (three) openings 17 is formed. Since features are otherwise the same as those in the method for manufacturing a semiconductor device shown in FIG. 3 and the like, the same member has the same reference number allotted and description thereof will not be repeated unless it is necessary.

As described already, partial discharge has been known to frequently occur also in the vicinity of an outer peripheral portion of a semiconductor device where terminal region 14 is formed. According to the method for manufacturing a semiconductor device in the variation, a creepage distance between terminal region 14 and opening 17 (electrode pad) can be longer by forming protrusion 16c so as to surround a plurality of openings 17. Thus, partial discharge in terminal region 14 can effectively be suppressed.

Figure 13:
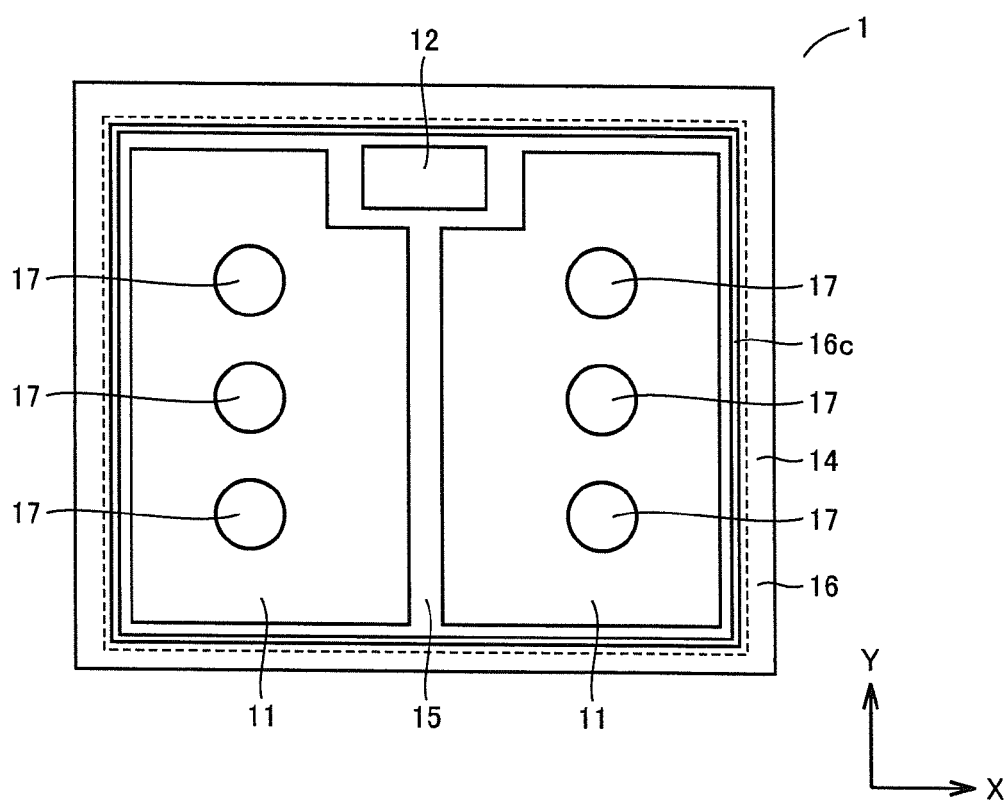
FIG. 13 is a plan view of a semiconductor device in which a protection film has been formed, showing one step in a method for manufacturing a semiconductor device according to another variation of the second embodiment.

Though the case where a protrusion is formed in correspondence with an opening exposing an emitter electrode has been described in the method for manufacturing a semiconductor device according to the variation, a manner of formation of a protrusion is not limited thereto, and a plurality of protrusions are preferably formed intensively in a terminal region or in the vicinity thereof where discharge is likely. For example, as shown in FIG. 13, protrusion 16c may be formed along a boundary between terminal region 14 and element region 15, or for example, such protrusions may be coupled to each other in semiconductor devices (semiconductor chips) adjacent to each other on a semiconductor wafer.

As described above, in the method for manufacturing a semiconductor device according to the second embodiment including the variation, an insulating protrusion is formed on a surface of a protection film. Thus, a creepage distance from a site where occurrence of partial discharge is likely can be increased so that an effect of suppression of partial discharge can be improved.

In each embodiment described above, an IGBT has been described by way of example of a semiconductor element formed on a semiconductor device. A semiconductor element is not limited to an IGBT so long as it is a power device (a semiconductor element) of which electrical characteristics are evaluated by applying a high current and a high voltage. A semiconductor device to which a current and a voltage are applied in a vertical direction is also applicable as a semiconductor device.

The present invention is effectively made use of in a method for manufacturing a semiconductor device having a semiconductor element for electric power.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising the steps of:
preparing a semiconductor substrate having a main surface;
forming a plurality of electrode pads on said main surface of said semiconductor substrate;
forming a protection film exposing said plurality of electrode pads and covering other regions; and
evaluating electrical characteristics by brining a contact probe in contact with exposed said electrode pads,
in said step of evaluating electrical characteristics, said electrical characteristics being evaluated by bringing a plurality of contact probes in contact with one electrode pad of said plurality of electrode pads, each of said plurality of contact probes contacting said one electrode pad through respective openings in said protection film, and
in said step of forming a protection film, a plurality of openings being formed in said protection film in such a manner that a portion where each of at least one contact probe and other contact probes of said plurality of contact probes is in contact with said one electrode pad is exposed.

2. The method for manufacturing a semiconductor device according to claim 1, wherein
said step of forming a protection film includes the step of stacking a plurality of insulating layers including one layer and another layer.

3. The method for manufacturing a semiconductor device according to claim 2, wherein
in said step of forming a protection film, said one layer and said another layer are formed of different materials.

4. The method for manufacturing a semiconductor device according to claim 2, wherein
in said step of forming a protection film, said another layer is formed to partially cover said one layer based on arrangement relation of said plurality of openings.

5. The method for manufacturing a semiconductor device according to claim 4, wherein
in said step of forming a protection film, said another layer is formed in a portion at an end of each opening of said plurality of openings and in a portion between one opening and another opening adjacent to each other of said plurality of openings.

6. The method for manufacturing a semiconductor device according to claim 2, comprising the steps of:
forming a semiconductor element on said main surface of said semiconductor substrate; and
forming a terminal structure holding a withstand voltage so as to surround a region where said semiconductor element has been formed, wherein
in said step of forming a protection film, said another layer is formed in a region where said terminal structure has been formed.

7. The method for manufacturing a semiconductor device according to claim 1, wherein
in said step of forming a protection film, a protrusion is formed on a surface of said protection film.

8. The method for manufacturing a semiconductor device according to claim 7, wherein
in said step of forming a protection film, said protrusion is formed to surround each of said plurality of openings.

9. The method for manufacturing a semiconductor device according to claim 7, wherein
in said step of forming a protection film, said protrusion is formed to surround said one electrode pad when viewed two-dimensionally.

10. The method for manufacturing a semiconductor device according to claim 7, wherein
in said step of forming a protection film, said protrusion is formed to surround said semiconductor device.

11. The method for manufacturing a semiconductor device according to claim 7, comprising the steps of:
forming a semiconductor element on said main surface of said semiconductor substrate; and
forming a terminal structure holding a withstand voltage so as to surround a region where said semiconductor element has been formed, wherein
in said step of forming a protection film, said protrusion is formed at a boundary between a region where said terminal structure has been formed and a region where said semiconductor element has been formed.

12. The method for manufacturing a semiconductor device according to claim 1, wherein
in said step of forming a protection film, said protection film is formed of any of a photoresist and Kapton®.

13. The method for manufacturing a semiconductor device according to claim 12, wherein
   in said step of forming a protection film, said protection film is formed of said Kapton® and said Kapton® is prepared as a sheet material having an adhesive layer.

14. The method for manufacturing a semiconductor device according to claim 7, wherein
   in said step of forming a protection film, said protrusion is formed of a photoresist.

* * * * *